US009334151B2

(12) United States Patent
Zuzek et al.

(10) Patent No.: US 9,334,151 B2
(45) Date of Patent: *May 10, 2016

(54) SHIELDING ELECTRONIC COMPONENTS FROM LIQUID

(71) Applicant: Wayne Fueling Systems LLC, Austin, TX (US)

(72) Inventors: Patrick Zuzek, Austin, TX (US); Mark J. Johnson, Elgin, TX (US)

(73) Assignee: Wayne Fueling Systems LLC, Austin, TX (US)

( * ) Notice: Subject to any disclaimer, the term of this patent is extended or adjusted under 35 U.S.C. 154(b) by 175 days.

This patent is subject to a terminal disclaimer.

(21) Appl. No.: 14/158,161

(22) Filed: Jan. 17, 2014

(65) Prior Publication Data

US 2014/0131386 A1 May 15, 2014

Related U.S. Application Data

(62) Division of application No. 11/863,054, filed on Sep. 27, 2007, now Pat. No. 8,668,560.

(51) Int. Cl.

| | |
|---|---|
| ***H05K 5/00*** | (2006.01) |
| ***H02K 7/20*** | (2006.01) |
| ***F24F 7/007*** | (2006.01) |
| ***B67D 7/84*** | (2010.01) |

(52) U.S. Cl.
CPC ........................................ *B67D 7/84* (2013.01)

(58) Field of Classification Search
CPC ............... B67D 7/84; H05K 5/00; H05K 7/20
USPC .................................. 454/184, 228; 361/695
See application file for complete search history.

(56) References Cited

U.S. PATENT DOCUMENTS

| | | | |
|---|---|---|---|
| 3,796,511 | A | 3/1974 | Hansen |
| 4,064,555 | A | 12/1977 | Ottenstein |
| 4,122,524 | A | 10/1978 | McCrory et al. |
| 4,410,949 | A | 10/1983 | Huellinghorst et al. |
| 4,659,349 | A | 4/1987 | Rodi et al. |
| 4,813,475 | A | 3/1989 | Couvrette |
| 4,817,043 | A | 3/1989 | Brown |
| 4,971,518 | A | 11/1990 | Florin |
| 5,099,403 | A | 3/1992 | Turner |
| 5,252,955 | A | 10/1993 | Davis et al. |
| 5,717,564 | A | 2/1998 | Lindale |

(Continued)

*Primary Examiner* — Helena Kosanovic
(74) *Attorney, Agent, or Firm* — Mintz Levin Cohn Ferris Glovsky and Popeo, P.C.

(57) ABSTRACT

Shielding liquid from electronic components may be accomplished by a variety of systems, devices, and techniques. A shielding device may include a substantially vertical channel mounted to a fuel dispenser component; an airflow inlet; a plurality of arrays of angled protrusions; and a plurality of substantially vertical protrusions. The channel is adapted to guide an airflow. The plurality of arrays of angled protrusions are, disposed within the channel and are substantially parallel in arrangement within each array. The angled protrusions within each array are angularly offset in arrangement relative to the angled protrusions within adjacent arrays. The arrays of angled protrusions are adapted to form a tortuous path for the airflow through the channel. The plurality of substantially vertical protrusions are disposed within the channel and are located between the airflow inlet and the plurality of arrays. The vertical protrusions are adapted to substantially straighten the airflow within the channel.

8 Claims, 12 Drawing Sheets

(56) References Cited

U.S. PATENT DOCUMENTS

| | | | | |
|---|---|---|---|---|
| 5,867,403 | A | 2/1999 | Sasnett, Jr. et al. | |
| 5,972,215 | A | 10/1999 | Kammel | |
| 6,493,440 | B2 | 12/2002 | Gromatzky et al. | |
| 6,505,774 | B1 | 1/2003 | Fulcher et al. | |
| 6,595,416 | B1 | 7/2003 | Newsome et al. | |
| 6,643,130 | B1 * | 11/2003 | DeMarchis et al. | 361/695 |
| 6,648,935 | B2 | 11/2003 | Petersen, Jr. | |
| 6,690,275 | B2 | 2/2004 | Long et al. | |
| 6,789,642 | B1 * | 9/2004 | Long et al. | 181/149 |
| 6,810,925 | B2 | 11/2004 | Graham et al. | |
| 6,945,456 | B2 * | 9/2005 | Magee et al. | 235/379 |
| 7,230,545 | B2 | 6/2007 | Nath et al. | |
| 8,157,628 | B2 * | 4/2012 | Villela et al. | 454/365 |
| 8,668,560 | B2 | 3/2014 | Zuzek et al. | |
| 2007/0064390 | A1 | 3/2007 | Yeh et al. | |
| 2007/0079582 | A1 | 4/2007 | Oh | |
| 2009/0087806 | A1 | 4/2009 | Zuzek et al. | |

* cited by examiner

SHIELDING ELECTRONIC COMPONENTS FROM LIQUID

CROSS REFERENCE TO RELATED APPLICATIONS

The present application is a divisional of U.S. application Ser. No. 11/863,054 filed on Sep. 27, 2007 and entitled “Shielding Electronic Components from Liquid,” which is hereby incorporated by reference in its entirety.

FIELD

This disclosure relates to shielding electronic components from liquid, and more particularly, to systems and techniques for shielding fuel dispenser components from liquid.

BACKGROUND

The retail petroleum industry utilizes fuel dispensing equipment in a variety of environments and locations. In some instances, a retail fueling location may include one or more fuel dispensers located in an outdoor environment. Although the outdoor environment may include a form of cover above the fuel dispenser, other retail fueling locations may include fuel dispensers in an uncovered environment. Moreover, fuel dispensers that may be covered by an awning or other form of cover may still be exposed to environmental conditions, such as, for example, sunlight, heat, snow, rain, hail, or fog. In addition to retail fueling locations that include fuel dispensers in an outdoor environment, some fueling locations may locate fuel dispensers in an indoor environment, yet exposed to various hazards, such as water, chemicals, or other intrusive substances. Regardless of the particular environment in which a fuel dispenser is located, users of the fuel dispenser, such as customers at the retail fueling location, have expectations that the fuel dispenser will function properly.

BRIEF DESCRIPTION

This disclosure relates to shielding electronic components from liquid, and more particularly, to systems and techniques for shielding fuel dispenser components from liquid.

In one general implementation, a component shielding device includes a substantially vertical channel mounted to a fuel dispenser component; an airflow inlet; a plurality of arrays of angled protrusions; and a plurality of substantially vertical protrusions. The channel is adapted to guide an airflow within the channel. In more specific aspects, the substantially vertical channel may include a longitudinal dimension of approximately 8 inches. In particular specific aspects, the fuel dispenser component may be an electronics head of the fuel dispenser; a currency acceptor; a payment module; or a fuel dispenser display. The airflow inlet is arranged substantially horizontal at a first end of the channel. The plurality of arrays of angled protrusions are disposed within the channel and are substantially parallel in arrangement within each array. The angled protrusions within each array are angularly offset in arrangement relative to the angled protrusions within adjacent arrays. Further, the arrays of angled protrusions are adapted to form a tortuous path for the airflow through the channel. The plurality of substantially vertical protrusions are disposed within the channel and are located between the airflow inlet and the plurality of arrays. The vertical protrusions are adapted to substantially straighten the airflow within the channel.

In some specific implementations, the component shielding device also includes a screen. In some aspects, the screen may be detachably mounted within the airflow inlet. The screen may be a stainless steel screen.

In certain aspects, the angled protrusions within each array may be offset at approximately 90 degrees relative to the angled protrusions within adjacent arrays. Further, the plurality of arrays may include at least four arrays of angled protrusions. Each array of angled protrusions may include at least seven angled protrusions. In particular implementations, the vertical and angled protrusions may be substantially oblate.

The component shielding device may include a fuel dispenser access panel where the access panel includes at least a portion of the substantially vertical channel. The fuel dispenser access panel may include the airflow inlet; one or more hinges adapted to attach the fuel dispenser access panel to the fuel dispenser; and a locking mechanism. The fuel dispenser access panel may be a polycarbonate fuel dispenser access panel. In some aspects, the fuel dispenser access panel may be a currency acceptor access panel where the currency acceptor access panel includes a currency inlet aperture. Also, in some implementations, the airflow inlet may be recessed within the currency acceptor access panel.

Various implementations of a component shielding device may include one or more of the following features. For example, a component shielding device may at least partially prevent liquid (e.g., water) from entering a fuel dispenser component, such as, for instance, a currency acceptor. As another example, a component shielding device may help prevent an unauthorized access into a fuel dispenser component by a foreign object, such as a fuel dispenser customer’s hand. As yet another example, a component shielding device may slow the momentum of an airflow pulled into the fuel dispenser used to cool and/or heat one or more components of the fuel dispenser in order to, for instance, allow liquid to be more easily removed from the airflow. As yet another example, a component shielding device may assist a gravitational effect in removing particulate matter entrained in the airflow.

These general and specific aspects may be implemented using a device, system, or method, or any combinations of devices, systems, or methods. The details of one or more implementations are set forth in the accompanying drawings and the description below. Other features will be apparent from the description and drawings, and from the claims.

BRIEF DESCRIPTION OF THE DRAWING

Like reference symbols in the various drawings indicate like elements.

DETAILED DESCRIPTION

Liquid intrusion prevention may be a concern in many industries in which electronic or electrical components or systems are placed and used in outdoor environments. In particular, the retail fuel dispensing industry may be one such industry where concern is generated due to the placement and use of electric or electronic components, such as fuel dispensers, in outdoor environments. Certain components of a fuel dispenser, such as, for instance, a currency acceptor, a payment module, a liquid crystal display (LCD), and an electronic "head" (ie., an embedded computer that may control, among other aspects, a pumping mechanism of the fuel dispenser), may function best in a substantially dry environment. These components, however, may also generate heat as they operate in the fuel dispenser. In some cases, beat dissipation may be desired in order for the fuel dispenser component (e.g., the currency acceptor) to remain functional and achieve its desired operating life. A system for maintaining an acceptable temperature operating range of the fuel dispenser component may be utilized to dissipate such heat generated by the component. The temperature maintenance system may include, more specifically, a centrifugal fan that circulates an airflow from an exterior to an interior of the fuel dispenser, separates the airflow into multiple airflows, such as a conditioning airflow and an ejected airflow, and directs the conditioning airflow to the fuel dispenser component. The system may also include an airflow separator, which receives the ejected airflow through a separator inlet and directs the ejected airflow to an exterior of the fuel dispenser through an outlet channel.

A component shielding device may prevent, at least in part, liquid from entering and contacting the fuel dispenser component when the temperature maintenance system is utilized. More specifically, the component shielding device may include a substantially vertical channel mounted to the fuel dispenser component and an airflow inlet horizontally arranged at an end of the channel. The channel may include multiple arrays of angled protrusions. The angled protrusions may be arranged substantially parallel within each array, and the angled protrusions within any particular array may be angularly offset from angled protrusions in adjacent arrays. The channel may also include substantially vertical protrusions between the airflow inlet and the arrays, which straighten the airflow within the channel. In combination, the arrays and vertical protrusions form multiple barriers and a tortuous path for the airflow through the channel, which may decrease an airflow momentum and allow particulates entrained in the airflow (e.g., liquid, dirt, dust, and grease) to be more easily removed.

Figure 1:
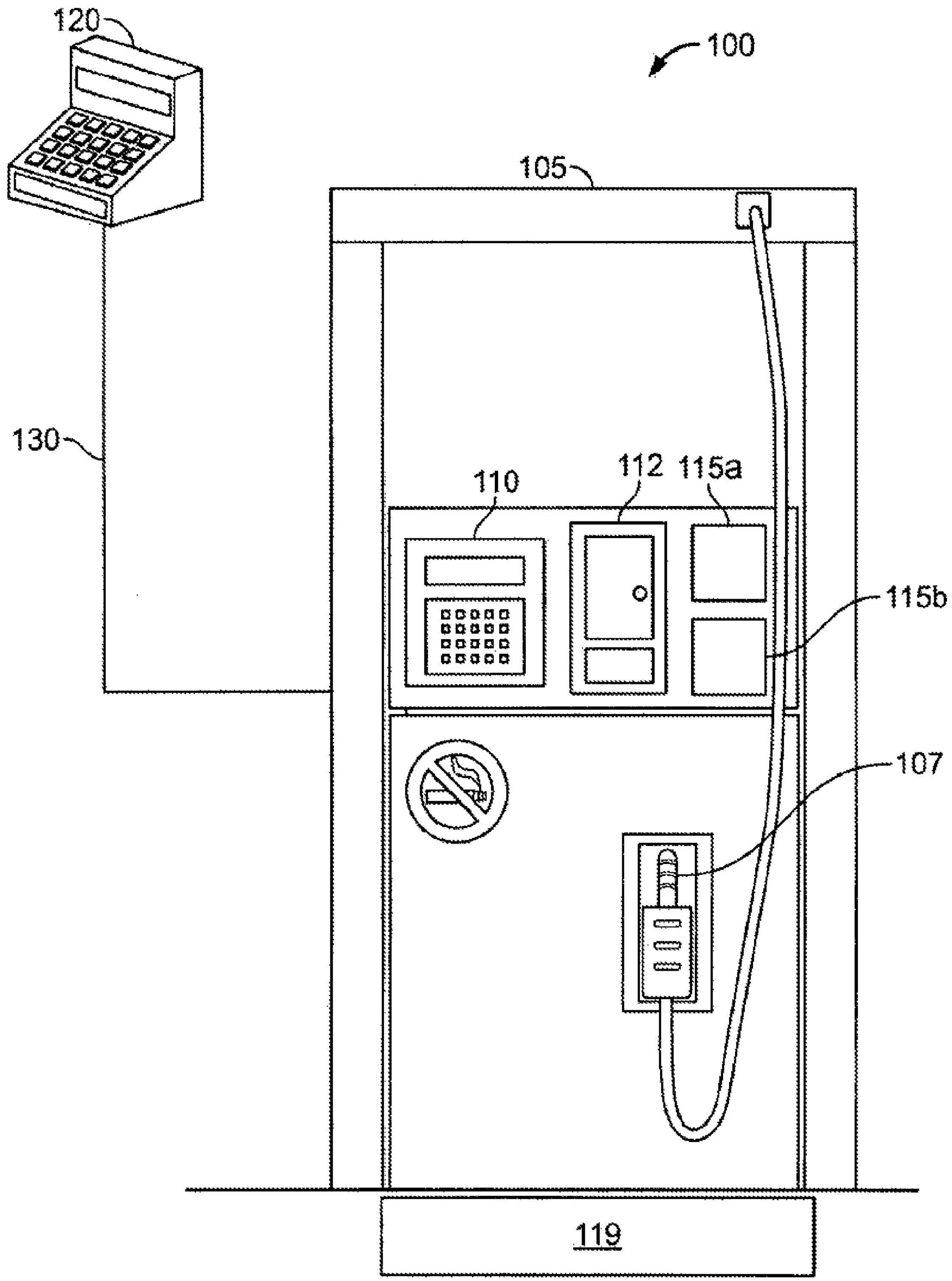
FIG. 1 illustrates a fuel dispensing environment, which may incorporate one or both of a temperature maintenance system and a component shielding device according to certain aspects of the present disclosure.

FIG. 1 illustrates a fuel dispensing environment 100 incorporating a temperature maintenance system and component shielding device. Environment 100 includes a fuel dispenser 105, a point-of-sale (POS) terminal 120, and a communication link 130. Generally, environment 100 allows for the supply, payment, and monitoring of one or more types of fuel in a retail, fleet fueling or other commercial environment, while simultaneously maintaining a temperature operating range of one or more components of fuel dispenser 105, as well as shielding liquid from entering one or more components of the dispenser 105.

Fuel dispenser 105 includes a nozzle 107, a payment module 110, a currency acceptor 112, multiple fuel dispenser components 115*a* and 115*b*, and a pumping mechanism 119. Generally, fuel dispenser 105 allows for a retail consumer or other purchaser to dispense fuel, e.g., unleaded gasoline, diesel, ethanol, or natural gas, into a private or public vehicle, and, in some aspects, allows for the payment of the fuel and generation of a receipt to the consumer. Fuel dispenser 105 may also, in some aspects, allow for directed advertising to the consumer for the cross-marketing of other products generally provided at a retail fueling environment, such as environment 100. For example, fuel dispenser 105 may allow a retail consumer to purchase cross-marketed products, such as a car wash or food and drink products. Further, in some aspects, fuel dispenser 105 may include ventilation slots in the fuel dispenser housing to, for example, allow ambient air into the fuel dispenser 105 or provide an outlet for an airflow brought into the dispenser 105.

As shown in FIG. 1, fuel dispenser 105 communicates to POS terminal 120 through communication link 130. Communication link 130, generally, allows for and facilitates the transmission of electronic data to and from the components of environment 100. More specifically, communication link 130 may be any form of wired communication, such as an RS-232 serial connection, a universal serial bus (USB) connection, all or a portion of a Local Area Network (LAN), a portion of a Wide Area Network (WAN), a modem or broadband connection, or a portion of the global network known as the Internet. Moreover, communication link 130 may utilize wireless communication, such as, for example, IEEE 802.11, Bluetooth, WiMax, or other radio frequency (RF) or infrared (IR) format. Fuel dispenser 105 may also communicate through wired or wireless signals to other systems, such as a credit or debit card payment system network, or other third party payment verification services.

Nozzle 107 is utilized for dispensing fuel, stored in under- or above-ground storage facilities, to the consumer's vehicle or a portable fuel enclosure. Generally, nozzle 107 is connected through a flexible conduit to a pumping mechanism 119, which pumps the consumer-chosen fuel from the storage facility through the nozzle 107 upon activation of the nozzle 107. One nozzle 107 is illustrated as integral to fuel dispenser 105, as shown in FIG. 1, however, fuel dispenser 105 may have multiple nozzles 107, each of which may dispense one or more distinct fuel types.

Continuing with FIG. 1, payment module 110 is shown integral to fuel dispenser 105. Generally, payment module 110 fits within an enclosure of fuel dispenser 105 and is secured within fuel dispenser 105. In particular aspects, the payment module 110 may be mounted on a locked, hinged access door of the fuel dispenser 105, such that access to the payment module 110 may be achieved by unlocking and opening the door. Further, payment module 110 may provide a tamper-resistant and/or tamper-sensitive enclosure for storing sensitive data, such as, for example, cryptographical data relevant to providing secure communications among and between the components of fuel dispenser 105, the POS terminal 120, and, in some aspects, third party entities, such as payment card authorization networks. The secure communications, generally, include sensitive data, such as customer financial and personal information, to be transmitted to the POS terminal 120 or a payment verification system (e.g., credit or debit card provider network or a financial institution network).

Fuel dispenser 105, shown in FIG. 1, includes currency acceptor 112 mounted within the dispenser 105. In some aspects, currency acceptor 112 may be a module communicably coupled to fuel dispenser 105 and mounted or located remote from the fuel dispenser 105. Generally, currency acceptor 112 allows a retail customer to purchase fuel or other products and services offered by environment 100 with cash (e.g., one, five, ten, twenty dollar bill denominations). The retail customer may insert the cash through a currency opening in the currency acceptor 112 to satisfy the purchase of the fuel or products. The operation of the currency acceptor 112 may generate heat within the acceptor 112 itself, as well as within the fuel dispenser 105. All or a portion of the generated heat may be removed from the currency acceptor 112 and fuel dispenser 105 through conduction and natural convection. For example, the heat may be conducted through the fuel dispenser 105 structure to ambient air, depending on the ambient conditions. Further, also depending on ambient conditions, the heat generated by the currency acceptor 112, as well as other various fuel dispenser components (e.g., payment module 110 and fuel dispenser components 115*a* and 115*b*), may be dissipated through the fuel dispenser 105 structure by natural convection (i.e., air movement across one or more exterior surfaces of the fuel dispenser 105).

Currency acceptor 112 also may include the temperature maintenance system to dissipate at least a portion of the heat generated by the acceptor 112. As shown in more detail in FIGS. 2-6, the temperature maintenance system may, generally, create a forced convection to and over one or more heat generating elements of currency acceptor 112. Moreover, as shown in more detail in FIGS. 2-5, currency acceptor 112 may include the component shielding device to prevent, at least in part, liquid from entering an aperture within the currency acceptor during the operation of the temperature maintenance system.

Fuel dispenser components 115*a* and 115*b* are also shown integral to fuel dispenser 105 and are representative of fuel dispenser components typically found in a retail fuel dispenser, such as fuel dispenser 105. Although two fuel dispenser components 115*a* and 115*b* are illustrated as integral to fuel dispenser 105, fewer or greater fuel dispenser components may be included in fuel dispenser 105, as appropriate. Moreover, fuel dispenser components 115*a* and 115*b* may be separate from, yet communicably coupled to, fuel dispenser 105. Fuel dispenser components 115*a* and 115*b* may include, for example, a card reader (e.g., a magnetic card reader, a smart card or integrated circuit card (ICC) reader, or a Radio Frequency Identification (RFID) card reader), a customer display (e.g., LCD), a keypad, a barcode scanner, a receipt printer, a soft key module, a biometric device, a pulser (i.e., a fuel meter), or other common retail fueling environment component. Fuel dispenser components 115*a* and 115*b* may be directly connected to payment module 110 within fuel dispenser 105 by a variety of communication devices and techniques, such as, for example, an RS-485 serial connection, an Ethernet connection, or other suitable connection. In particular aspects, one or both of the fuel dispensing components 115*a* and 115*b* may include the temperature maintenance system and component shielding device.

Pumping mechanism 119 is coupled to fuel dispenser 105 and operates to pump a customer-chosen fuel from a fuel storage tank through nozzle 107 so that a retail customer may refuel a vehicle. Pumping mechanism 119, generally, is any type of positive displacement mechanism, including valves and fuel conduit, appropriate to a retail fueling environment. Although illustrated as physically coupled to fuel dispenser 105 in FIG. 1, pumping mechanism 119 may be located at the fuel storage tank and may operate through commands received from, for instance, the fuel dispenser 105 or POS terminal 120, as appropriate. Pumping mechanism 119 may also be disabled by the payment module 110 or POS terminal 120 should an unauthorized action occur. Upon disablement, pumping mechanism 119 may be unable to pump the customer-chosen fuel from the fuel storage tank through nozzle 117.

Continuing with FIG. 1, POS terminal 120 is connected to fuel dispenser 105 through communication link 130. POS terminal 120 may also be communicably connected to a variety of other networks or services, such as, for example, a payment verification service provided by a credit or debit card company or financial institution. In some aspects, POS terminal 120 is located within the premises of a retail fuel environment such as a gasoline station, retail convenience store, grocery stores, or "big box" retailer. In particular aspects, POS terminal 120 may be located within a commercial or fleet fueling center, where, for instance, commercial vehicles may be refueled exclusive of the presence of private vehicles. POS terminal 120 may also be located remote from the fuel dispensing environment 100.

Generally, POS terminal 120 may be any device which monitors one or more fuel dispensers 105 and acts to authorize fueling transactions. The POS terminal 120, in some aspects, may be the main controller (or computer) that controls and coordinates the activities of environment 100. In some embodiments, more than one POS terminal 120 may be present within the environment 100. Generally, POS terminal 120 includes memory, as well as one or more processors, and comprises an electronic computing device operable to receive, transmit, process, store, or manage data associated with the environment 100. Generally, this disclosure provides merely one example of computers that may be used with the disclosure. As used in this document, the term "computer" is intended to encompass any suitable processing device. For example, POS terminal 120 may be implemented using computers other than servers, as well as a server pool. Indeed, POS terminal 120 may be adapted to execute any operating system including Linux, UNIX, Windows Server, or any other suitable operating system. According to one embodiment, POS terminal 120 may also include or be communicably coupled with a web server and/or a mail server.

Figure 2A:
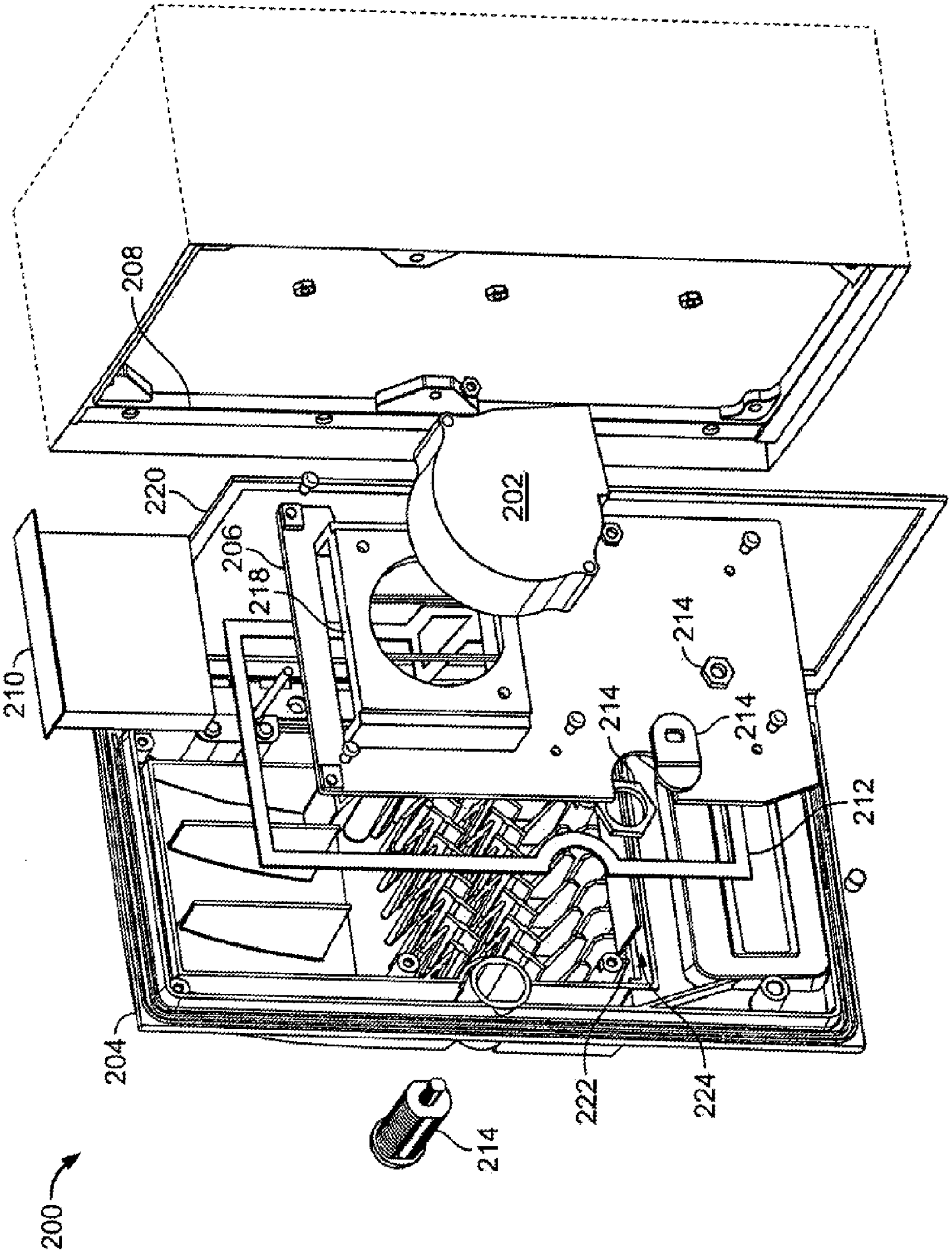
FIGS. 2A-C illustrate various perspectives of one or both of a temperature maintenance system and a component shielding device according to certain aspects of the present disclosure.
Figure 2B:
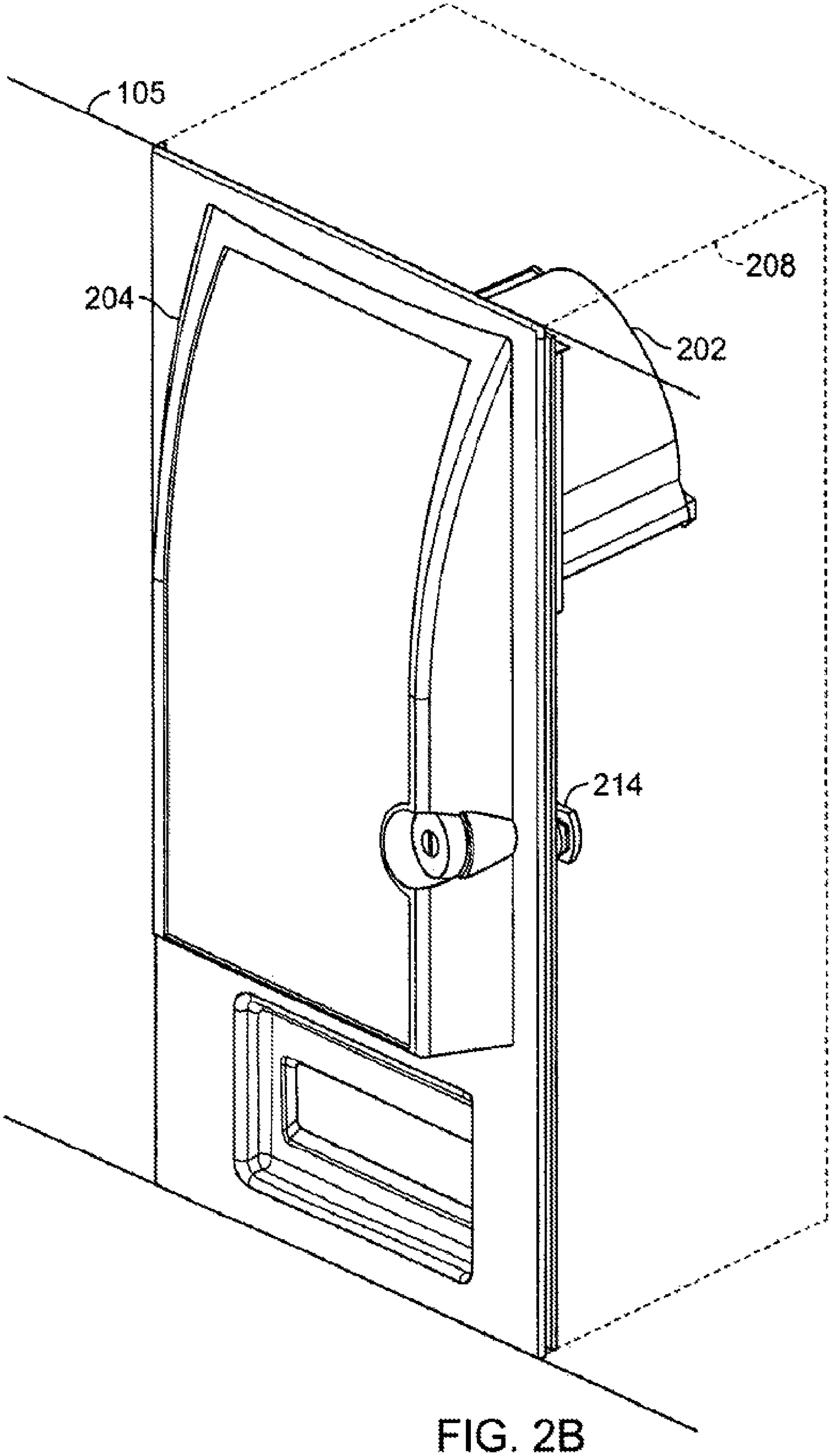
Figure 2C:
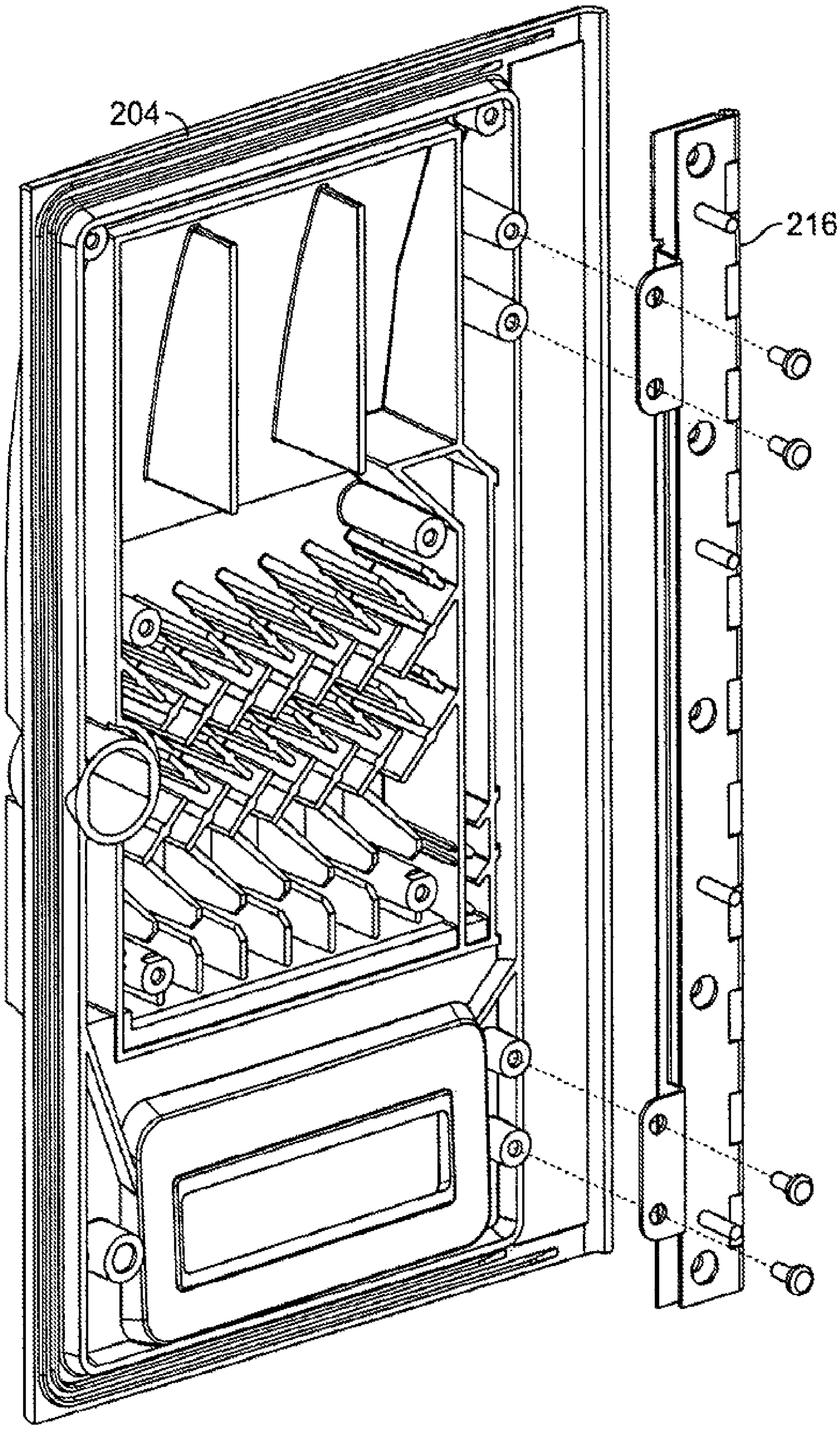

FIGS. 2A-C illustrate an exploded view and various perspectives of one implementation of a system 200, which encompasses at least a portion of a temperature maintenance system and a component shielding device according to certain aspects of the present disclosure. In some aspects, system 200 may be utilized as part of a currency acceptor in a fuel dispenser, such as the currency acceptor 112 as part of fuel dispenser 105 in environment 100. Turning to the system shown in FIG. 2A, system 200 includes a centrifugal fan 202, a currency acceptor access panel 204, a fan panel 206, a filter 210, gaskets 212 and 220, a filter slot 218, a screen 222, and an airflow opening 224. FIG. 2B illustrates another perspective of system 200 and shows a locking mechanism 214 included in system 200. FIG. 2C illustrates yet another perspective of system 200 and shows a hinge 216 included in system 200.

Currency acceptor access panel 204 (also described in more detail in FIG. 4A) provides an exterior cover for the currency acceptor 112 and closes against a currency acceptor housing 208 of the currency acceptor 112. Generally, currency acceptor access panel 204 is made of a non-corrosive material, such as, for example, stainless steel, titanium, or a rigid plastic (e.g., polycarbonate). As illustrated in FIG. 2A, currency acceptor access panel 204 may include a flanged edge, thus allowing currency acceptor access panel 204 to close flush against the currency acceptor housing 208. In some aspects, a sealant may be utilized between the currency acceptor access panel 204 and currency acceptor housing 208 at the flanged edge to further ensure an environmentally secure enclosure. Gasket 220, also, may be placed between the currency acceptor access panel 204 and the currency acceptor housing 208 to help ensure a secure enclosure. Gasket 220 may be any appropriate compressible material that ensures a mechanical seal between panel 204 and housing 208, such as paper, rubber, silicone, metal, cork, felt, fiberglass, or plastic polymer (e.g., polychlorotrifluoroethylene). In certain embodiments, currency acceptor access panel 204 may further include an aperture to allow the lock 214 (shown in an exploded view in FIG. 2A) to be installed in the access panel 204.

Centrifugal fan 202 is mounted to fan panel 206 and, generally, operates to induce an airflow from an exterior of the fuel dispenser 105 through, for example, the airflow opening 224. As illustrated in FIG. 2A, in some aspects, centrifugal fan 202 may be mounted flush to the filter slot 218 by, for example, one or more mechanical fasteners. An inlet opening of centrifugal fan 202 may, therefore, be substantially flush against the filter 210 such that the airflow induced by centrifugal fan 202 flows through the filter 210 before entering the centrifugal fan housing. Centrifugal fan 202 may be a single speed fan and include forward curved fan blades in some aspects, but airfoil blades or other blade types, may be utilized as appropriate. Centrifugal fan 202, in some aspects, is an electrically powered centrifugal fan which draws power from the fuel dispenser 105 through a power transformer. But centrifugal fan 202 may utilize any appropriate power source, such as natural gas or electricity generated through solar or wind power.

Continuing with FIG. 2A, the operation of centrifugal fan 202 may, in some aspects, separate the airflow into a conditioning airflow and an ejected airflow through the centrifugal motion of the fan 202. For example the airflow induced through the airflow opening 224 may include particulate matter (e.g., liquid, dust, dirt, grease droplets, etc.). The particulate matter, in some cases, is heavier than the airflow molecules in which they are entrained. As the airflow passes through the centrifugal fan 202 and its housing, the rotational motion of the centrifugal fan 202 induces centrifugal forces directed perpendicular to the rotation and away from a center of rotation of the fan 202. Such centrifugal force may act on the particulate matter, pushing the matter to an outer edge of the airflow within the fan 202. The outer edge of the airflow, e.g., the ejected airflow, may then contain a majority of the particulate matter entrained in the airflow passing through airflow opening 224. The inner edge of the airflow, e.g., a conditioning airflow, may thus comprise less than half of the particulate matter entrained in the airflow.

Fan panel 206 mounts to the currency acceptor access panel 204 and includes filter slot 218 for filter 210. In some aspects, fan panel 206 mounts to the access panel 204 through mechanical fasteners, such as screws, bolts, clasps, or other appropriate means. Fan panel 206, however, may mount to the currency acceptor access panel 204 with an adhesive. In some aspects, a gasket 212 may be utilized between the currency acceptor access panel 204 and fan panel 206. Gasket 212, like gasket 220, may be any appropriate compressible material that ensures a mechanical seal between panels 204 and 206, such as paper, rubber, silicone, metal, cork, felt, fiberglass, or plastic polymer (e.g., polychlorotrifluoroethylene). Fan panel 206 also provides a mounting location for centrifugal fan 202. Centrifugal fan 202 may be attached to the fan panel 206 through, for example, mechanical means or an adhesive. In some aspects, fan panel 206 is made of a non-corrosive material, such as stainless steel, titanium, or rigid plastic (e.g., polycarbonate).

Continuing with FIG. 2A, fan panel 206 may include filter slot 218. Filter slot 218, generally, is an open-ended enclosure in which filter 210 may rest, for example, during the operation of the temperature maintenance system and the component shielding device. Filter slot 218 may be attached to the fan panel 206 through mechanical means, such as one or more screws, bolts, clips, or other appropriate means, such as a chemical adhesive. But filter slot 218 may also be formed integral with the fan panel 206, for instance, within implementations where both the fan panel 206 and filter slot 218 may be formed of rigid plastic (e.g., polycarbonate). In some aspects, filter slot 218 may include one or more filter clips to secure the filter 210 within the filter slot 218. In some implementations, as illustrated in FIG. 2A, centrifugal fan 202 may be secured to the fan panel 206 via the filter slot 218. In certain implementations, the filter slot 218 may further include an aperture or multiple apertures within the filter slot 218 enclosure to allow the airflow to pass through the filter 210 and filter slot 218 to an inlet of the centrifugal fan 202.

Filter 210, generally, fits within filter slot 218 at the inlet of the centrifugal fan 202 and reduces a quantity of particulate matter (e.g., liquid, dust, dirt, grease, etc.) from the airflow during operation of the fan 202. Filter 210 may, in some aspects, be a replaceable, open cell foam filter with a paper top. For example, an employee, a worker, or a third party contractor of the fuel dispensing environment 100 may replace the filter 210 as needed, such as, for example, when the filter 210 is visually dirty or when an acceptable airflow pressure drop (e.g., inches of water, inches of mercury, pounds per square inch) of filter 210 is exceeded. In certain embodiments, filter 210 may be a fiber media filter or a cleanable, permanent filter, such as a stainless or galvanized steel mesh filter.

Turning now to FIG. 2B, system 200, including currency acceptor access panel 204, centrifugal fan 202, and currency acceptor housing 208 is shown as these elements fit within the fuel dispenser 105. As illustrated in FIG. 2B, currency acceptor access panel 204 may include lock 214. Generally, lock 214 may be any device which secures the currency acceptor access panel 204 closed and flush against the fuel dispenser 105. In some aspects, lock 214 is a keyed lock. Lock 214 may also include, as shown in FIG. 2B, a rotatable lever which turns to secure the panel 204 against the currency acceptor housing 208.

FIG. 2C illustrates another perspective of the currency acceptor access panel 204 in system 200. System 200 may also include a hinge 216. Hinge 216, typically, is secured to the currency acceptor access panel 204 and the currency acceptor housing 208 and allows the currency acceptor access panel 204 to open and close, flush against the fuel dispenser 105 as needed. Hinge 216 may be secured to the currency acceptor access panel 204 and the currency access housing 208 through mechanical fasteners, such as rivets, screws, or bolts, but hinge 216 may also be secured with a chemical adhesive in place of or in addition to the mechanical fasteners. In some aspects, the hinge 216 may be secured directly to the fuel dispenser 105. Hinge 216, in some embodiments, is a piano hinge. Hinge 216, however, may be a butt hinge or any other appropriate device allowing access panel 204 to swing outward from fuel dispenser 105. For example, in certain embodiments, hinge 216 may be secured to a top or bottom edge of the currency acceptor access panel 204 such that the access panel 204 opens vertically. Moreover, as illustrated in FIG. 2C, currency acceptor access panel 204 may include a flanged edge to allow the hinge 216 to secure flush against the access panel 204.

Returning to FIG. 2A, system 200 also includes screen 222. The screen 222, generally, is installed across the airflow opening 224, and prevents, at least in part, any unauthorized entry into the currency acceptor access panel 204. For example, the screen 222 may prevent insects from entering the access panel 204 through the airflow opening 224. The screen 222 may also prevent a person from reaching inside the access panel 204 through the airflow opening 224. Regardless, the screen 222, in certain embodiments, is a steel mesh screen. Moreover, screen 222 may be made of a non-corrosive material, such as stainless steel, titanium, galvanized steel, or plastic.

Figure 3A:
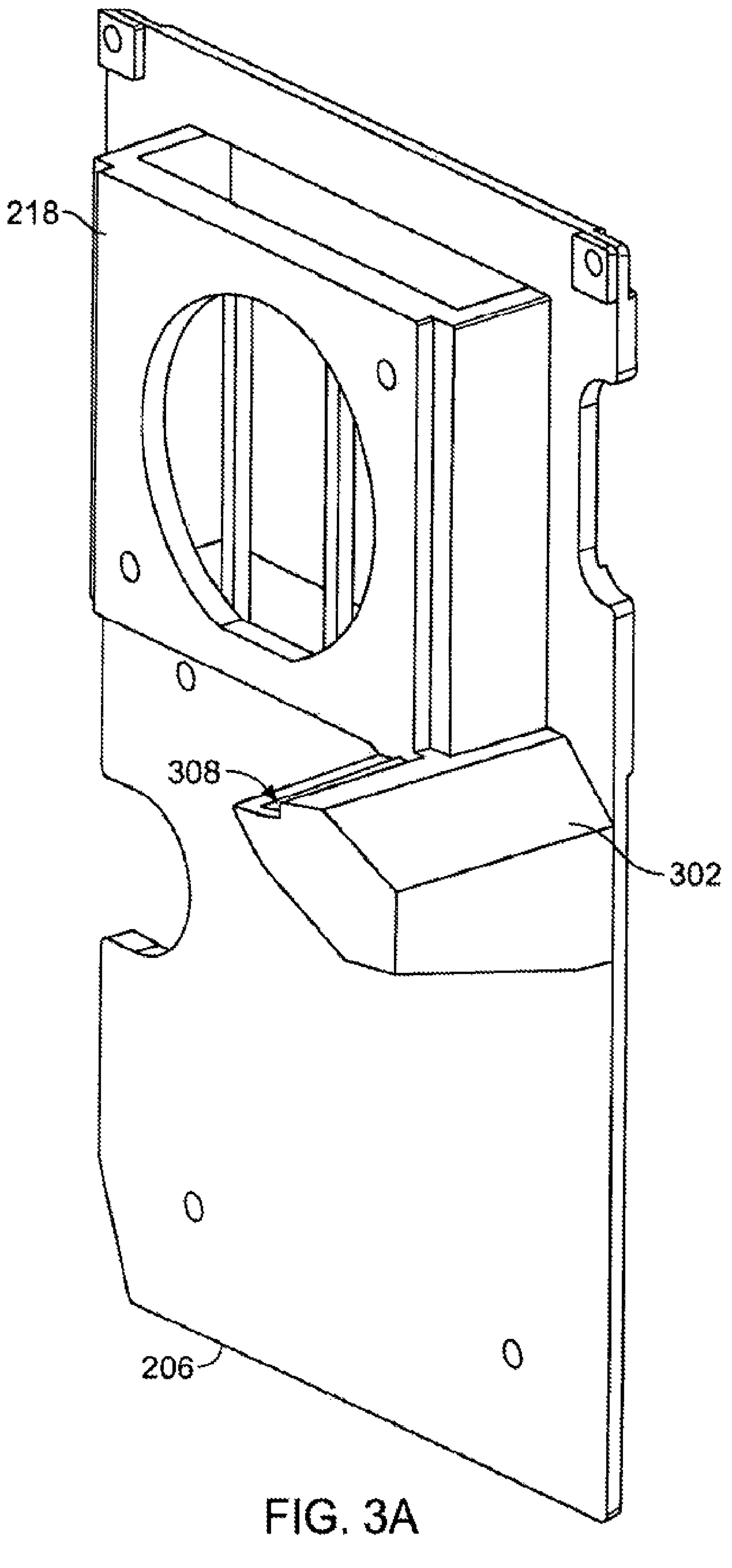
FIGS. 3A-D illustrate various perspectives of a fuel dispenser component that may be used with one or both of a temperature maintenance system and a component shielding device according to certain aspects: of the present disclosure.
Figure 3B:
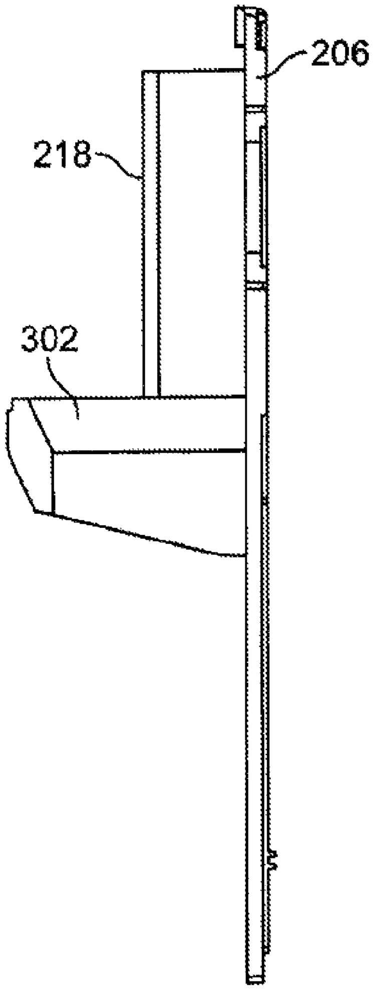
Figure 3D:
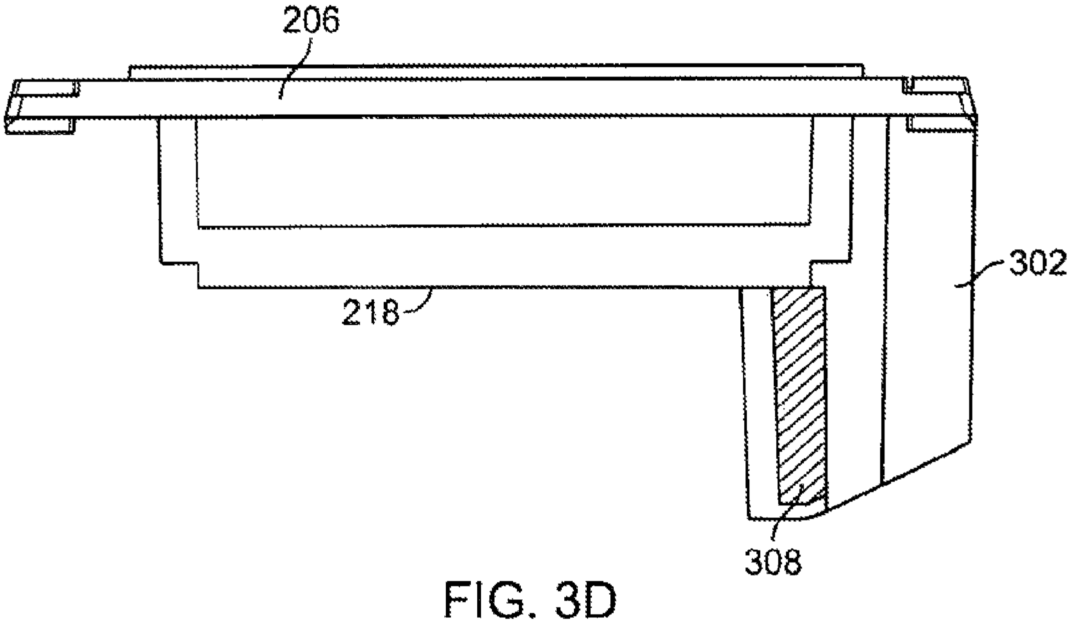
Figure 3C:
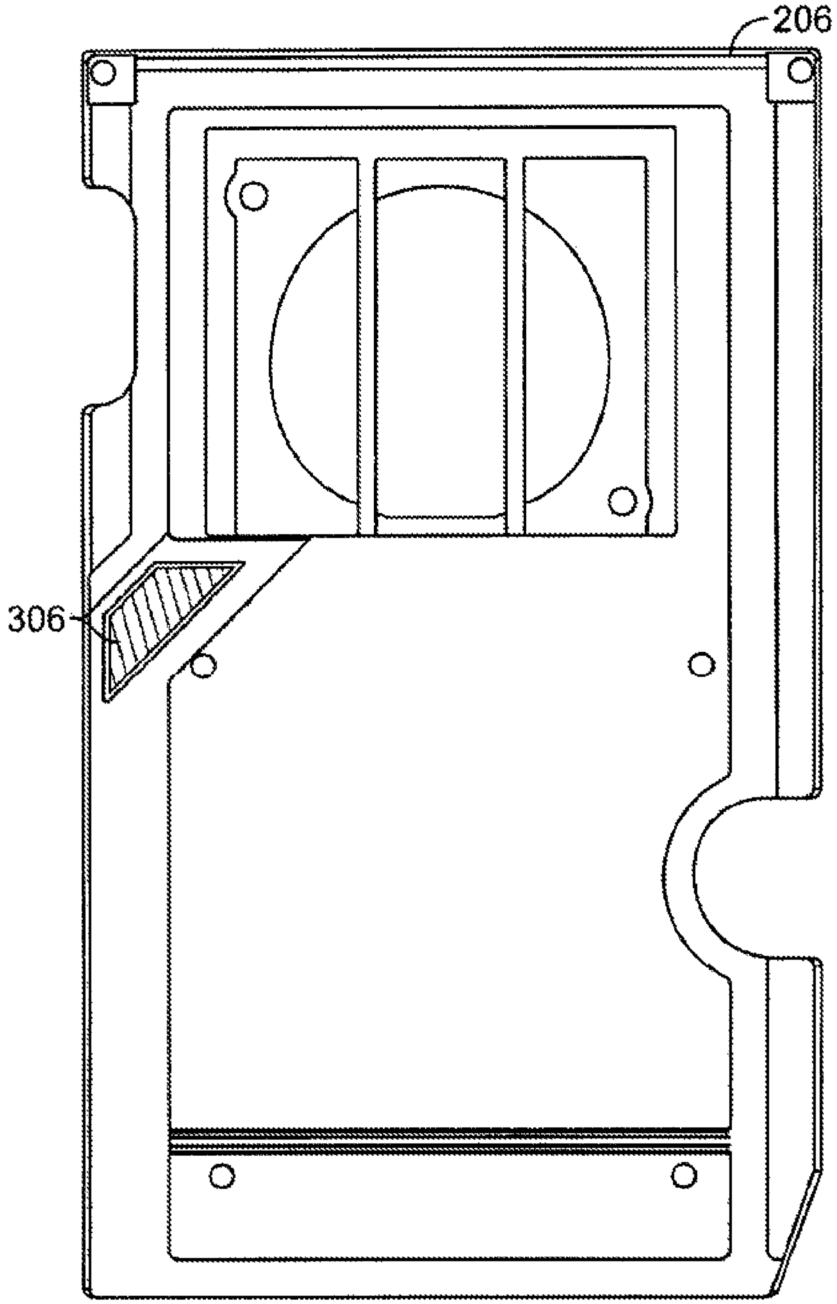

FIGS. 3A-D illustrate several different perspectives of one implementation of fan panel 206. Turning to FIG. 3A, fan panel 206 also includes an airflow separator 302. Airflow separator 302 includes a separator inlet 308 (also shown in FIG. 3D). Turning briefly to FIG. 3C, fan panel 206 also includes an outlet channel opening 306 on a backside of the fan panel 206 (i.e., the side of the fan panel 206 opposite of the centrifugal fan 202, filter slot 218, and airflow separator 302). Returning to FIG. 3A, airflow separator 302, typically, receives a portion of an output airflow from the centrifugal fan 202 such as the ejected airflow from fan 202, and directs the ejected airflow through the fan panel 206 and the outlet channel opening 306. Airflow separator 302 also, generally, mounts to the fan panel 206 at the outlet of the centrifugal fan 202 such that the ejected airflow enters the airflow separator 302 through the separator inlet 308.

Continuing with FIGS. 3A-B, in some aspects, airflow separator 302 may be mounted to the fan panel 206 as a cantilevered airflow separator 302. In some implementations of airflow separator 302, the separator 302 may be mounted to the fan panel through mechanical fasteners, but airflow separator 302 may also be attached to the fan panel 206 by an adhesive. Particular implementations of airflow separator 302 may be integrally formed with the fan panel 206. For example, the fan panel 206 and airflow separator 302 may be formed as a single, cast piece of rigid plastic (e.g., polycarbonate).

The ejected airflow, may, in some aspects, comprise approximately 4-5% of the airflow of the centrifugal fan 202 and approximately 60-6.5% of the particulate matter, depending on, for example, particulate density and size, entrained in the airflow. In these embodiments, an opening area of the separator inlet 308, as illustrated in FIG. 3D, may comprise approximately 6-7% of an outlet area of the centrifugal fan 202. In particular embodiments, the ejected airflow may comprise about 1-3% of the airflow of centrifugal fan 202 and almost 60% of the particulate matter (e.g., liquid, dirt, dust, grease) entrained in the airflow, depending on, for example, particulate density and size, while the separator inlet 308 is sized at approximately 5% of the outlet area of the fan 202. In some aspects, the ejected airflow may comprise approximately 5-10% of the airflow of the fan 202 and about 70% of the entrained particulate matter while the separator inlet is sized at about 10% of the outlet area of the fan 202.

Figure 4A:
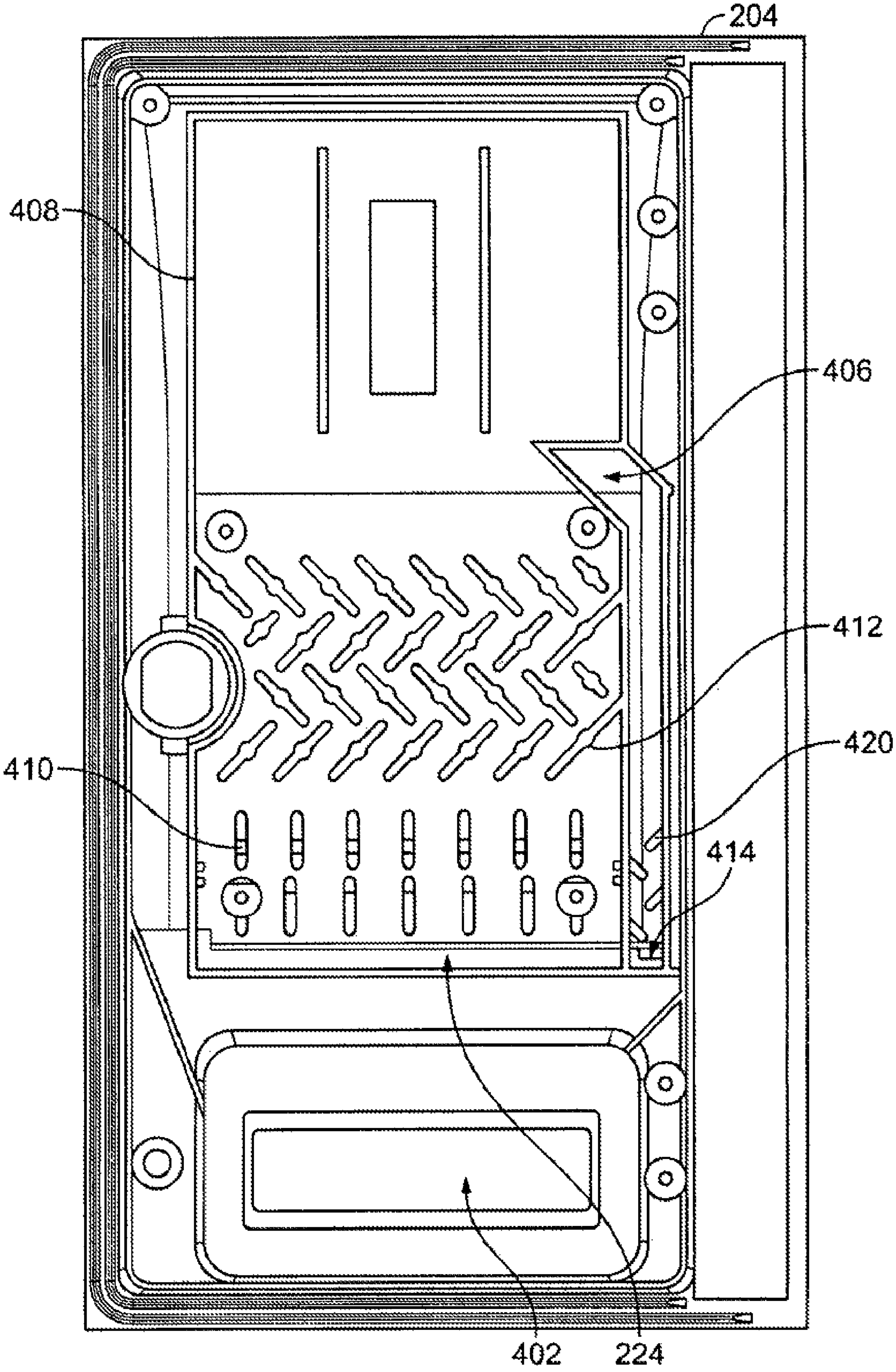
FIGS. 4A-C illustrate additional perspectives of one or both of a temperature maintenance system and a component shielding device according to certain aspects of the present disclosure.
Figure 4B:
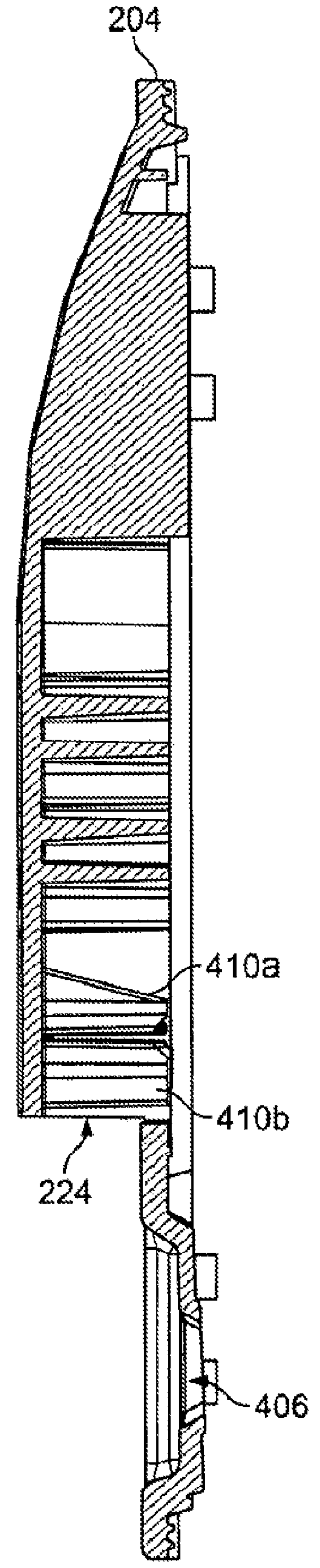
Figure 4C:
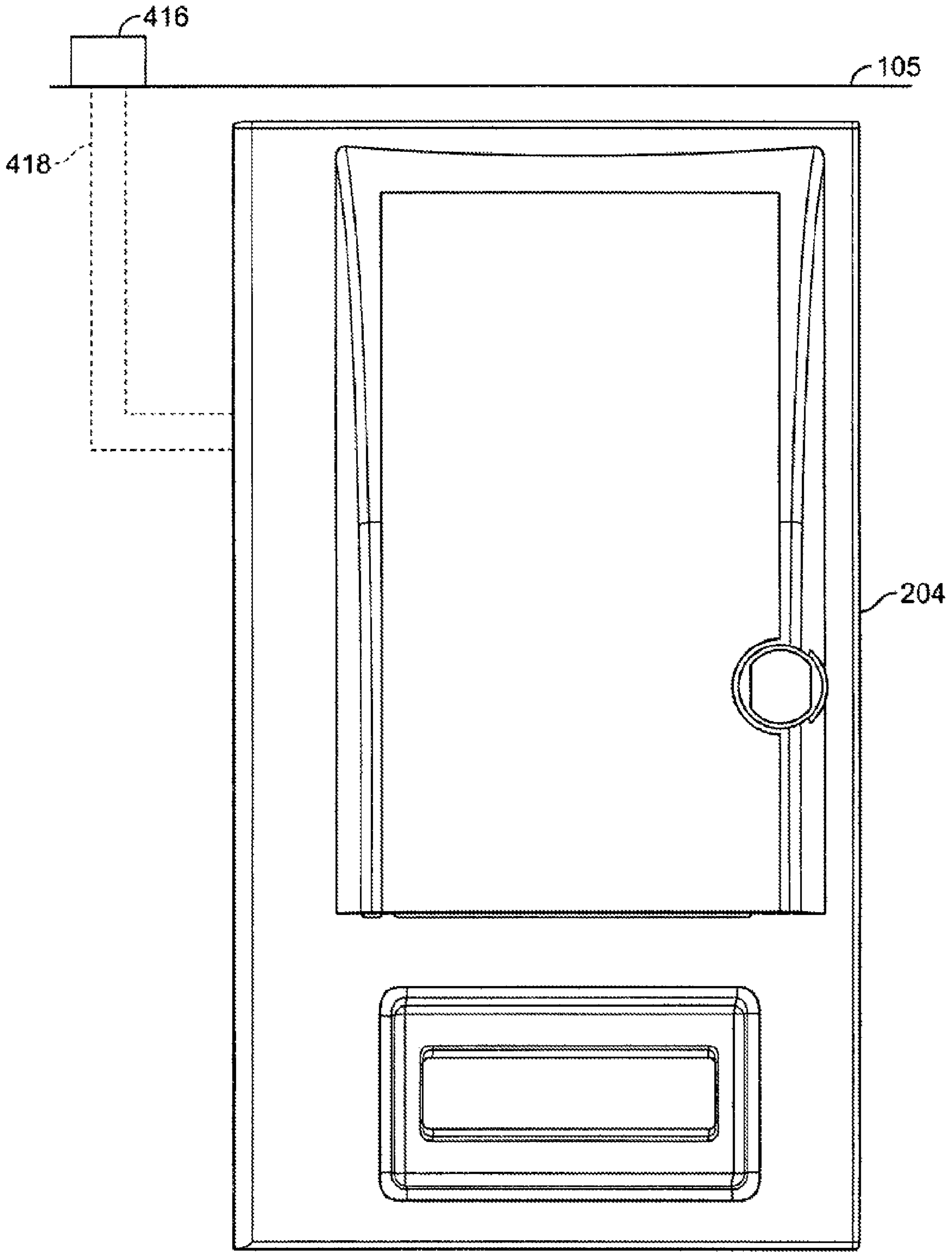

FIGS. 4A-C illustrate additional perspectives of one implementation of the currency acceptor access panel 204 as used in the component shielding device and the temperature maintenance system. FIG. 4A illustrates the currency acceptor access panel 204 in more detail, including the airflow opening 224, a currency inlet 402, an outlet channel 406, an airflow channel 408, vertical protrusions 410, angled protrusions 412, and an ejected airflow outlet 414. Generally, the currency acceptor access panel 204 provides a path for the airflow generated by the centrifugal fan 202 while at least partially preventing particulate matter (e.g., liquid, dirt, dust, grease) entrained within the airflow from remaining in the airflow prior to reaching at least one of the filter 210 and the centrifugal fan 202. Particulate matter may be prevented from remaining in the airflow because, for example, the airflow momentum is decreased as the airflow travels from the airflow opening 224, past the vertical protrusions 410, and through the tortuous path created by the angled protrusions 412, thus allowing heavier matter within the airflow (e.g., liquid, dirt, dust, grease) to fall out of the airflow.

Focusing on FIGS. 4A and B, currency inlet 402 is a substantially rectangular aperture in currency acceptor access panel 204. In some aspects, as shown, the currency inlet 402 is located in a lower portion of the access panel 204. Generally, the currency inlet 402 provides a location for a user of the fuel dispenser 105 to insert currency (e.g., bills) in order to purchase fuel or other services or products offered at fuel dispensing environment 100. In some aspects, the currency inlet 402 may be recessed within the currency acceptor access panel 204, as shown in FIG. 4B. The currency inlet 402, in certain implementations, may be approximately ¾ inches by 3 inches in dimensions.

Outlet channel 406 is a vertical shaft in the currency acceptor access panel 204 which may provide, in some aspects, an outlet for the ejected airflow to exit the fuel dispenser 105 via the ejected airflow outlet 414. In certain implementations, one end of the outlet channel 406, for instance a top end opposite the ejected airflow outlet 414, may be aligned with the outlet channel opening 306. Turning briefly to FIG. 3C, the outlet channel opening 306 and the top end of the outlet channel 406 may be substantially similar in shape in particular aspects. As described above, fan panel 206, when assembled with the currency acceptor access panel 204, may be flush against the access panel 204, thus allowing the ejected airflow to flow through the outlet channel opening 306 to the outlet channel 406 with substantially no blockage. Returning to FIG. 4A, the outlet channel 406 may also include one or more outlet protrusions 420. The outlet protrusions 420 may allow, in some aspects, the ejected airflow to decrease in velocity prior to exiting the fuel dispenser 105 through the ejected airflow outlet 414.

Continuing with FIG. 4A, the outlet channel 406 may be integrally formed within the currency acceptor access panel 204 in certain aspects. For example, the access panel 204 may be formed of rigid plastic (e.g., polycarbonate) with the outlet channel 406 integrally formed with the access panel 204. In many implementations, the outlet channel 406 may be a removable portion of the currency acceptor access panel 204, yet attached within the access panel 204 through mechanical fasteners or chemical adhesive.

Airflow channel 408, generally, provides a path for the airflow generated by the centrifugal fan 202 to follow within the currency acceptor access panel 204 during the operation of, for example, the component shielding device and the temperature maintenance system. In some aspects, as illustrated by FIG. 4A, the airflow channel 408 is a substantially vertical channel rectangular in shape within the access panel 204. The airflow channel 408 may, in some aspects, have a longitudinal dimension of approximately 8 inches, a transverse dimension of approximately 4¼ inches, and a channel depth of approximately 1 inch. Turning briefly to FIG. 4B, which shows a cut-away perspective of the currency acceptor access panel 204, the airflow opening 224 is located at a bottom end of the airflow channel 408 and allows the airflow generated by the centrifugal fan 202 to enter the airflow channel 408 within the currency acceptor access panel 204 from the exterior of the fuel dispenser 105. In particular embodiments, as illustrated in FIG. 4B, the airflow opening 224 is oriented horizontally within the currency acceptor access panel 204 and recessed from a front of the access panel 204. The currency acceptor access panel 204 may, thus, provide a shroud-like cover for the airflow opening 224.

Continuing with FIG. 4A, one or more vertical protrusions 410 may be disposed within the airflow channel 408. Generally, the vertical protrusions 410 at least partially straighten the airflow generated by the centrifugal fan 202 as it enters the airflow channel 408 via the airflow opening 224. Moreover, the vertical protrusions 410 may help decrease the momentum of the airflow generated by the fan 202 such that heavier particles entrained in the airflow (e.g., liquid, dirt, dust, grease) may fall out of the airflow due to the gravitational effect. In some aspects, the vertical protrusions 410 may also help prevent an unauthorized entry into the currency acceptor access panel 204, such as, for example, an attempt by a person to insert one or more fingers into the access panel 204. The vertical protrusions 410, in some aspects, may also, in part, secure the screen 222 within the airflow opening 224. Vertical protrusions 410 may be integrally formed with the currency acceptor access panel 204 in certain embodiments, but may also be separately attached to the access panel 204 through any appropriate means. As illustrated in FIG. 4A, certain implementations may include multiple vertical protrusions 410, such as seven vertical protrusions 410 spaced evenly across the airflow channel 408. Vertical protrusions 410 may be located in a single row across the airflow channel 408 or multiple rows as the application requires. For example, if liquid may enter the airflow channel 408 directly, multiple rows of vertical protrusions 410 may be utilized to decrease airflow momentum and allow the liquid to drop out of the airflow as it passes within the channel 408.

Focusing briefly on. FIG. 4B, each vertical protrusion 410 may be split into an upper section 410*a* and lower section 410*b*. The upper section 410*a* may be generally triangular in shape and protrude from the airflow channel 408 approximately 1 inch. The lower section 410*b* may be generally rectangular in shape and also protrude from the airflow channel 408 approximately 1 inch.

Returning to FIG. 4A, multiple angled protrusions 412 may be located within the airflow channel 408. Generally, the angled protrusions 412 are placed within the channel 408 to create a tortuous path for the airflow generated by the centrifugal fan 202 to navigate through, thereby decreasing the momentum of the airflow and allowing heavier particles entrained within the airflow (e.g., liquid, dirt, dust, grease) to drop out of the airflow. In addition, the angled protrusions 412 may present barriers to the particulate matter entrained within the airflow such that the particulates are knocked down from the airflow. In some aspects, multiple rows of angled protrusions 412 may be utilized. For instance, as illustrated in FIG. 4A, four rows of seven angled protrusions 412 may be utilized to decrease the momentum of the airflow while efficiently using the space within the airflow channel 408. The angled protrusions 412, in certain embodiments, are formed integrally with the airflow channel 408, for example, as a single piece of the airflow channel 408. In some implementations, however, the angled protrusions 412 are separate structures detachably secured to the airflow channel 408.

Continuing with FIG. 4A, the placement of the angled protrusions 412 within each row of angled protrusions 412, as well as within multiple rows of protrusions 412, may create a tortuous path for the airflow generated by the fan 202 to navigate within the airflow channel 408. For example, angled protrusions 412 within a particular row may be approximately 45 degrees from horizontal, substantially parallel in alignment, and evenly spaced across the airflow channel 408. Angled protrusions 412 within adjacent rows, however, may be oriented differently. For instance, adjacent rows to any particular row of angled protrusions 412 may have protrusions 412 oriented substantially perpendicular to those angled protrusions 412 within the particular row. In particular implementations, however, angled protrusions 412 within the adjacent rows may be oriented at any appropriate angle relative to those angled protrusions in the particular row.

FIG. 4C illustrates one implementation of currency acceptor access panel 204 within the fuel dispenser 105 including an airflow port 416 and a snorkel tube 418. Generally, airflow port 416 is located at the exterior of the fuel dispenser 105 (e.g., top or side) and allows the airflow generated by the centrifugal fan 202 to be drawn from a particular location exterior of the fuel dispenser 105. For example, in some aspects, the airflow generated by the fan 202 may be drawn from the exterior of the fuel dispenser via the airflow opening 224 and the airflow port 416. In particular embodiments, the generated airflow may be exclusively drawn from the fuel dispenser exterior via the airflow port 416 due to, for instance, regulatory requirements of the fuel dispenser 105. Airflow port 416 may, in some aspects, include a filter, screen, or cover to, in part, remove particulate matter from the airflow entering the port 416. Moreover, the airflow port 416 may include a water shedding device, such as one or more louvers, shrouds, or air dampers. The snorkel tube 418 is connected to the airflow port 418 and provides a substantially enclosed route for the generated airflow to the currency acceptor access panel 204. For example, the snorkel tube 418 may be connected to the currency acceptor housing 208 and allow the airflow to enter the currency acceptor access panel 204.

Figure 5:
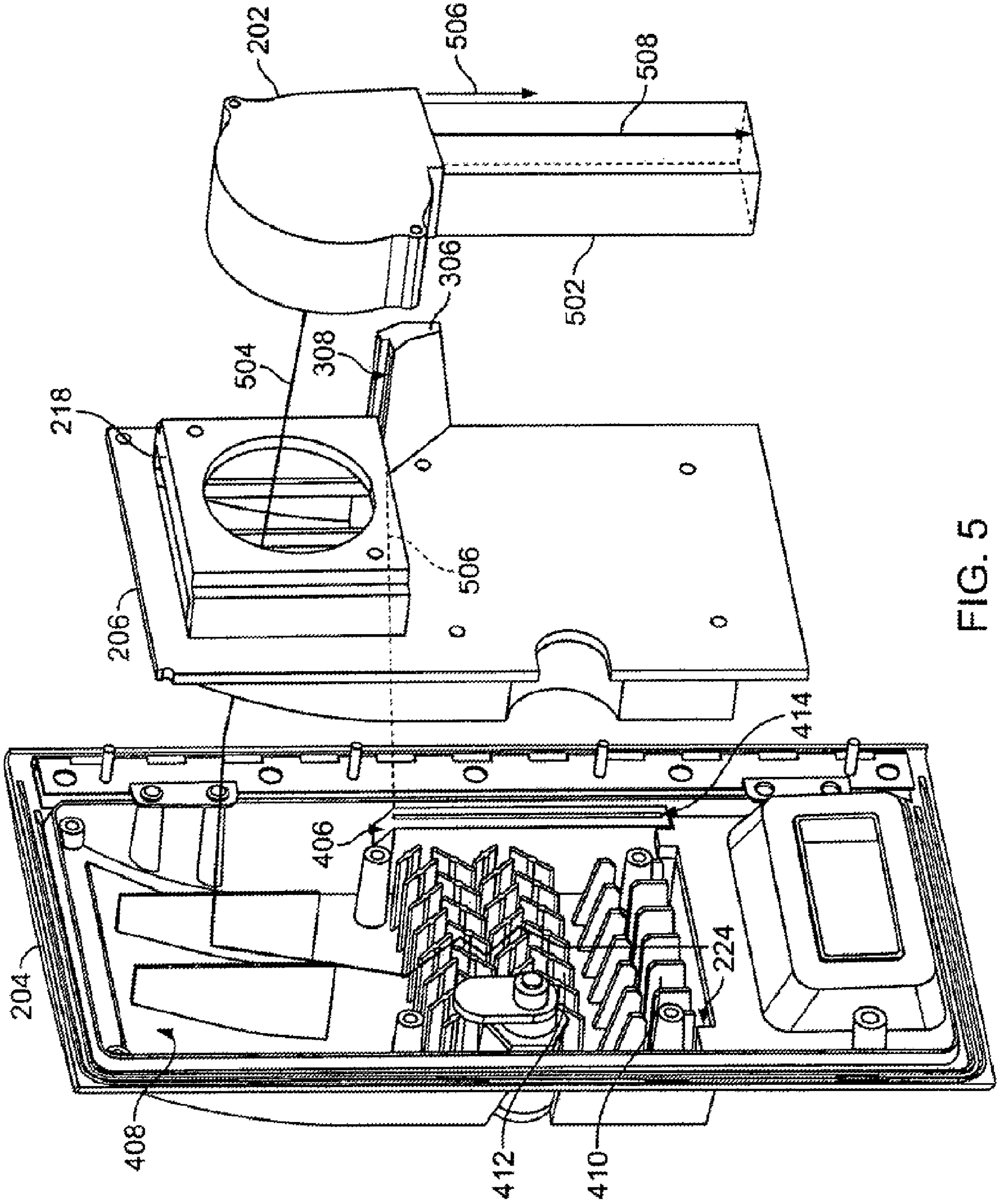
FIG. 5 illustrates one method of operation of one or both of a temperature maintenance system and a component shielding device according to certain aspects of the present disclosure.

FIG. 5 illustrates one mode of operation of a component shielding device and temperature maintenance system. Various components of system 200 may be utilized in the operation of the component shielding device and temperature maintenance system. For example, the centrifugal fan 202, currency acceptor access panel 204, fan panel 206, airflow opening 224, airflow separator 302, outlet channel 406, airflow channel 408, vertical protrusions 410, angled protrusions 412, and ejected airflow outlet 414 may comprise all are part of the component shielding device and temperature maintenance system. A conditioning airflow path 502 may also be included in one or both of the component shielding device and temperature maintenance system. The conditioning airflow path 502, generally, provides a substantially sealed enclosure for the conditioning airflow 508 to travel from the outlet of the fan 202 to a fuel dispenser component, such as, a currency acceptor.

Generally, the operations of various components of the system 200 are as follows. Power is provided to the centrifugal fan 202 such that an airflow 504 is generated through the fan 202. The generated airflow 504 is supplied from an exterior of the currency acceptor access panel 204 via, for example, the airflow opening 224. The generated airflow 504 proceeds through the vertical protrusions 410 and may, at least partially, be substantially straightened by the vertical protrusions 410. The generated airflow 504 then travels through one or more rows of angled protrusions 412, such as, for example, four rows of seven angled protrusions 412 each. The tortuous path created by the angled protrusions 412 directs the generated airflow 504 through one or more changes of direction, such as direction changes of approximately 90 degrees. As the generated airflow 504 travels through the vertical protrusions 410 and angled protrusions 412, particulate matter entrained in the generated airflow 504 (e.g., liquid, dirt, dust, grease) may fall out of the airflow 504 due to, for example, the decrease in momentum of the airflow 504, gravitational effects, and physical barriers created by the protrusions 410 and 412. Moreover, in some aspects, the centrifugal fan 202 may be sized such that it is capable of pulling the generated airflow 504 through the tortuous path created by the protrusions 410 and 412 yet substantially incapable of pulling particulate matter through the path.

Continuing with FIG. 5, the generated airflow 504 continues through an aperture in the fan panel 206 to enter the fan 202. In some aspects, the generated airflow 504 may pass through the filter 210 either prior to or subsequent to entering the fan 202. Upon entering the centrifugal fan 202, the generated airflow 504 may be substantially separated into multiple airflows through centrifugal forces generated by the rotation of fan 202. For example, a majority of the particulate matter may be centrifugally forced to an outer edge of the airflow 504, i.e., an ejected airflow 506. The generated airflow 504 along an inner edge of the airflow, i.e., a conditioning airflow 508, may thus contain a minority of the particulate matter still entrained in the airflow 504. Upon exiting the fan 202, the ejected airflow 506 enters the airflow separator 302 via the separator inlet 308. For example, the separator inlet 308 may be sized and located to receive substantially all of the ejected airflow 506, i.e., the outer edge of the generated airflow 504, while receiving substantially none of the conditioning airflow 508. The ejected airflow 506 then travels to the outlet channel 406 via the airflow separator 302 and subsequently, to an exterior of the fuel dispenser 105 through the ejected airflow outlet 414. The conditioning airflow 508 may enter, subsequent to exiting the fan 202, the conditioning airflow path 502 and be directed to the fuel dispenser component, such as a currency acceptor. By directing the conditioning airflow 508 to, for example, the currency acceptor, the currency acceptor may be maintained within an acceptable operating temperature range. The conditioning airflow 508 may then exit the fuel dispenser 105 through, for instance one or more vents within the fuel dispenser housing.

Figure 6:
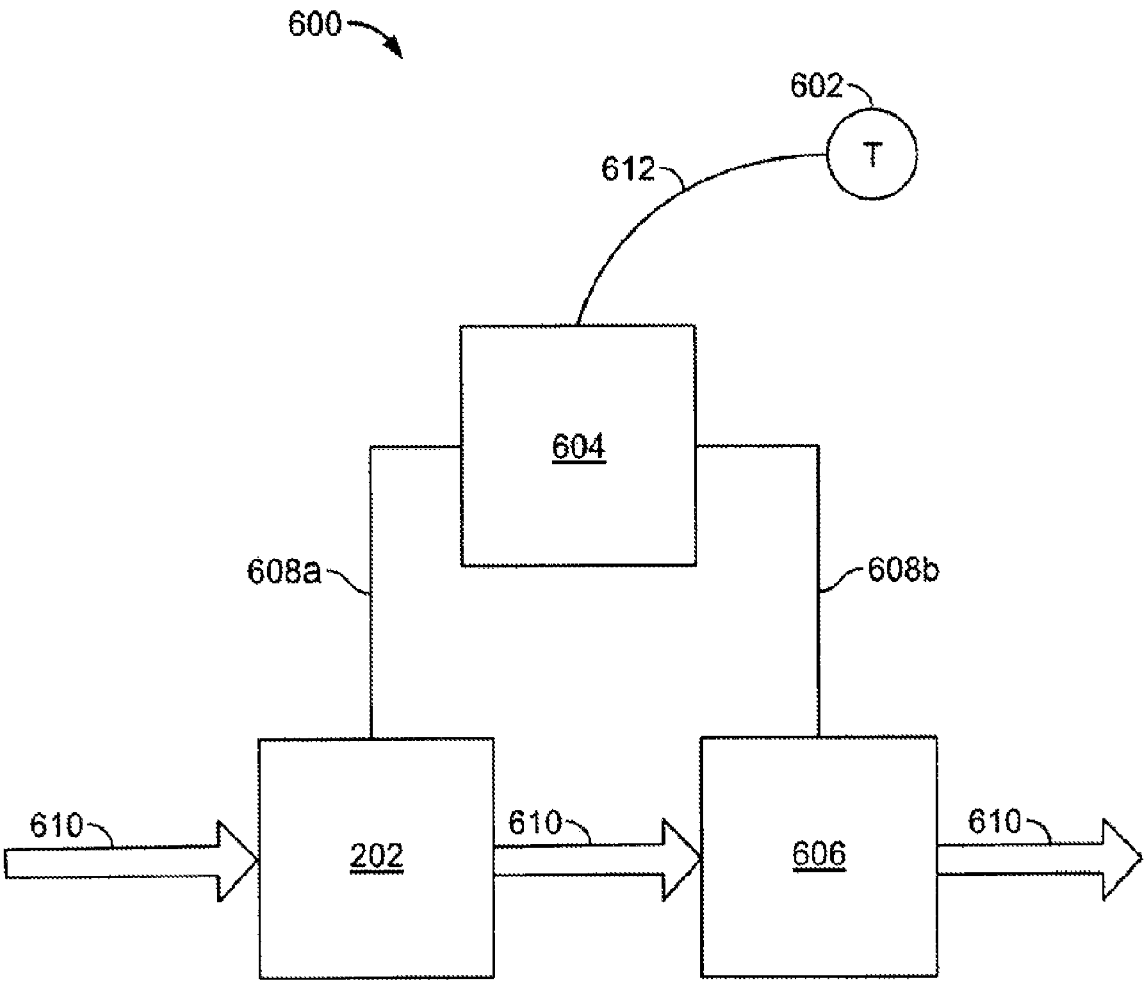
FIG. 6 is a block diagram illustrating a control module that may be used with one or both of a temperature maintenance system and a component shielding device according to certain aspects of the present disclosure.

FIG. 6 is a block diagram illustrating a control module 600 that may be used in conjunction with at least one of a temperature maintenance system and a component shielding device. The control module 600 operates in conjunction with the centrifugal fan 202 and includes a temperature sensor 602, a controller 604, a heater 606 (e.g., an electric resistance heater), control signals 608*a* and 608*b*, a generated airflow 610, and a sensor output 612. Generally, the control module 600 operates to control at least one of the fan 202 and the heater 606 in response to an output 612 of the temperature sensor 602.

Temperature sensor 602 measures a fuel dispenser temperature and outputs an electric signal (e.g., current signal or voltage signal) to the controller 604 as the sensor output 612. Temperature sensor 602 may be, for example, a resistance temperature detector (RTD), a thermistor, or a thermocouple. The temperature sensor. 602, for instance, may measure an ambient temperature surrounding the fuel dispenser 105 or a temperature within the interior of the fuel dispenser housing. In some aspects, temperature sensor 602 measures a temperature within a currency acceptor, such as within the currency acceptor housing 208. Although illustrated as a single temperature sensor 602, multiple temperature sensors 602 may be utilized with multiple sensor outputs 612. The sensor output 612 may be a hard-wired signal to the controller 604, or, in some aspects, may be a wireless signal to the controller 604.

Controller 604 is, typically, an electrical or electronic device, which can receive a discrete signal (e.g., current signal or voltage signal) representative of a temperature value and output one or more control signals based on the temperature value signal. In some aspects, controller 604 may be a simple switch that controls power to one or more of the fan 202 or heater 606. Controller 604 and temperature sensor 602, however, may be combined in a single device (e.g., a thermostat). For example, controller 604 may receive the sensor output 612 and compares the output 612 to a temperature set point value stored or programmed into the controller 604. Based on the resultant comparison between the sensor output 612 and the temperature set point value, the controller 604 may send one or more signals 608*a* and 608*b* to the fan 202 and the heater 606, respectively. For example, in certain aspects, the control module 600 may operate in a cooling mode. In these aspects, if a temperature measured by the temperature sensor 602 rises above the temperature set point, controller 604 may send a signal 608*a* to the fan 202 such that the fan 202 is engaged and generates the airflow 610. The generation of the airflow 610 may, as described with reference to FIGS. 2-5, maintain an operating temperature of a fuel dispenser component, such as a currency acceptor. As the measured temperature falls below the temperature set point, the controller 604 may send a signal 608*a* to the fan 202 to reduce the speed of fan 202 or, in some aspects, turn off the fan 202 altogether. In particular embodiments of the control module 600, however, the fan 202 may operate continuously or substantially continuous when power is supplied to, for example, an electronics head of the fuel dispenser 105, the fuel dispenser 105, or particular components of the fuel dispenser 105.

The controller 604 may also, in certain embodiments, operate in a dual mode, i.e., a heating and cooling mode. For example, the controller 604 may include a heating set point temperature and a cooling set point temperature. Thus, as a temperature measured by the temperature sensor 602 falls below the heating set point temperature, the controller 604 may send at least one of signals 608*a* and 608*b* to the fan 202 and heater 606, respectively. For instance, the controller 604 may first send signal 608*a* to engage the fan 202. If the generated airflow 610 fails to raise the measured temperature above the heating set point, the controller 604 may then send signal 608*b* to engage the heater 606. In some aspects, the heater 606 may be a multistage heater 606 such that controller 604 may incrementally increase an output of the heater 606 through signal 608*b*. Moreover, in the, dual mode, a temperature measured by the temperature sensor 602 may rise above the cooling set point temperature. In this situation, the controller 604 may operate substantially similar to a controller 604 operating in the cooling mode, as described above.

In some aspects, controller 604 may control multiple heaters and fans. For example, fuel dispenser 105 may include a recirculating fan and heater combination typically utilized to recirculate air within the interior of the dispenser 105, in addition to the fan 202 and heater 606. Controller 604 may, along with one or more temperature sensors 602, control the recirculating fan and heater in combination with the fan 202 and heater 606.

A number of implementations have been described, and several others have been mentioned or suggested. Furthermore, those skilled in the art will readily recognize that a variety of additions, deletions, alterations, and substitutions may be made to these implementations while still shielding electronic components from liquid. Thus, the scope of protected subject matter should be judged based on the following claims, which may capture one or more aspects of one or more implementations.

What is claimed is:

1. A currency acceptor for use in a fuel dispenser, comprising:

a currency acceptor housing having an access panel coupled thereto for providing access to the housing, and having an opening for receiving payment; and a temperature maintenance system disposed within the currency acceptor housing and including a channel that is substantially vertical, an airflow inlet arranged substantially horizontal at a first end of the channel, a plurality of arrays of angled protrusions disposed within the channel, the angled protrusions within each array being substantially parallel in arrangement, the angled protrusions within each array angularly offset in arrangement relative to the angled protrusions within adjacent arrays, the arrays of angled protrusions adapted to form a tortuous path for the airflow through the channel, and a plurality of substantially vertical protrusions disposed within the channel, the vertical protrusions located between the airflow inlet and the plurality of arrays, the vertical protrusions adapted to substantially straighten the airflow within the channel.

2. The system of claim 1, wherein the plurality of arrays of angled protrusions and the plurality of substantially vertical protrusions are mounted on the access panel.

3. The system of claim 1, further comprising a non-corrosive screen detachably mounted within the airflow inlet.

4. The system of claim 1, wherein the angled protrusions within each array are offset at approximately 90 degrees relative to the angled protrusions within adjacent arrays.

5. The system of claim 1, wherein the plurality of arrays comprise at least four arrays of angled protrusions.

6. The system of claim 1, wherein each array of angled protrusions comprises at least seven angled protrusions.

7. The system of claim 1, further comprising a currency inlet aperture in the access panel.

8. The system of claim 1, wherein the access panel is coupled to the housing by one or more hinges, and wherein the access panel includes a locking mechanism.

* * * * *